US009755664B2

(12) United States Patent
Mickelsen et al.

(10) Patent No.: US 9,755,664 B2
(45) Date of Patent: Sep. 5, 2017

(54) METHODS AND APPARATUS FOR EFFICIENT ILLUMINATION OF INDIVIDUAL KEYS IN A KEYBOARD

(75) Inventors: Jeremy Mickelsen, Denver, CO (US); Alex Lammers, Washington, MO (US)

(73) Assignee: EchoStar Technologies L.L.C., Englewood, CO (US)

( * ) Notice: Subject to any disclaimer, the term of this patent is extended or adjusted under 35 U.S.C. 154(b) by 641 days.

(21) Appl. No.: 12/975,904

(22) Filed: Dec. 22, 2010

(65) Prior Publication Data

US 2012/0162085 A1 Jun. 28, 2012

(51) Int. Cl.
*G06F 3/02* (2006.01)
*H03M 11/20* (2006.01)

(52) U.S. Cl.
CPC ........... *H03M 11/20* (2013.01); *G06F 3/0202* (2013.01); *H01H 2219/036* (2013.01); *H01H 2219/04* (2013.01)

(58) Field of Classification Search
CPC ....................................................... G06F 3/02
USPC .................................... 341/20, 21, 22, 23
See application file for complete search history.

(56) References Cited

U.S. PATENT DOCUMENTS 5,424,731 A * 6/1995 Kronberg ..................... 341/26
5,534,860 A * 7/1996 Phillips et al. ................. 341/22
2002/0163299 A1 * 11/2002 Hato ....................... H05B 33/26
313/505
2005/0159126 A1 * 7/2005 Wang ........................ 455/226.4
2008/0001787 A1 * 1/2008 Smith et al. ................... 341/23

FOREIGN PATENT DOCUMENTS

| DE | 3540434 A1 | 5/1987 |
| EP | 408765 A1 * | 1/1991 |
| EP | 0480765 A1 | 1/1991 |
| EP | 0441129 A1 | 8/1991 |

OTHER PUBLICATIONS

European Patent Office, International Searching Authority, "International Search Report" mailed Mar. 2, 2012; International Appln. No. PCT/US2011/063571, filed Dec. 6, 2011.
Dribin, D., "Keyboard Matrix Help," <http: //www.dribin. orgjdavejkeyboardjone_html/> vol. 1, Jun. 2000.

* cited by examiner

Primary Examiner — Amine Benlagsir
(74) Attorney, Agent, or Firm — LK Global

(57) ABSTRACT

A keyboard is able to illuminate particular keys and to detect keypresses in an efficient manner. The keys of the array are logically arranged into one or more two-dimensional arrays (e.g., row/column arrays) so that the illumination and keypress detection functions share a common set of electrical signal lines in one dimension of the array. By coupling both the lights and the key actuation switches of each key to a common set of signal lines in one dimension, the number of signal lines used in the keyboard can be reduced.

10 Claims, 3 Drawing Sheets

METHODS AND APPARATUS FOR EFFICIENT ILLUMINATION OF INDIVIDUAL KEYS IN A KEYBOARD

TECHNICAL FIELD

The following discussion relates to keyboards, and more particularly relates to keyboards with illuminating keys.

BACKGROUND

Keyboards are widely used to input text, numbers, cursor controls and/or other data to a wide variety of different devices. Many personal computer systems, for example, use conventional "QWERTY", Dvorak or other keyboards to provide text entry, cursor control and/or any number of other inputs. Many other devices, including mobile telephones, smart phones, personal digital assistants, wireless communications devices, video game players and the like also include numeric or alphanumeric keyboards for entering phone numbers, text messages and other forms of input. Still other products use keyboards to provide different types of data entry. Conventional remote controls, for example, commonly incorporate keyboards that receive user inputs for adjusting the settings of controlled components such as televisions, media players, set-top boxes (including satellite and/or cable television receivers), audio/video components, climate controls and many other products. Many other types of keyboards are used to provide inputs to many additional types of devices as well.

Some keyboards are now lighted to provide an improved user experience. Lighted keyboards can be used to improve key visibility to the user, to emphasize certain keys while de-emphasizing others, or for any other purpose. Illuminated keyboards can be complicated, however, by the need to individually connect and manage lights for each of the keys as well as the need to detect keypresses of each of the various keys. This relatively large number of signal paths can consume a large number of input/output pins on a digital controller, and can be mechanically complex to manufacture. Although multiplexing or other decoding logic could be used to reduce some of the wiring, this would add complexity and cost to the design.

It is therefore desirable to create systems, devices and/or methods to efficiently yet effectively provide an illuminated keyboard. These and other desirable features and characteristics will become apparent from the subsequent detailed description and the appended claims, taken in conjunction with the accompanying drawings and this background section.

BRIEF SUMMARY

According to various exemplary embodiments, a keyboard is logically arranged into one or more two-dimensional arrays to illuminate particular keys and to detect keypresses as appropriate. The keys of the array are logically arranged into one or more two-dimensional arrays (e.g., row/column arrays) so that the illumination and keypress detection functions share a common set of electrical signal lines in one dimension of the array. By coupling both the lights and the key actuation switches of each key to a common set of column lines, for example, the number of signal lines used in the keyboard can be reduced.

Various embodiments provide a keyboard system. The system suitably comprises a plurality of keys logically arranged into an array such that each of the keys is logically addressable by a row value and a column value; a plurality of lights, each light associated with one of the keys and having a first light terminal and a second light terminal; a plurality of switches, each switch associated with and actuated by one of the plurality of keys and having a first switch terminal and a second switch terminal; a plurality of light select lines, wherein each of the light select lines is coupled to each of the first light terminals associated with the keys having a common row value; a plurality of switch lines, wherein each of the switch lines is coupled to each of the first switch terminals associated with the keys having the common row value; and a plurality of common lines each coupled to the second light terminals and to the second switch terminals associated with keys having a common column value.

Other embodiments provide a keyboard system that suitably comprises a plurality of keys; a plurality of lights, wherein each of the lights is associated with one of the keys and comprises a first and a second light terminal, and wherein the plurality of lights is logically arranged into a light array comprising a first light dimension and a second dimension; a plurality of switches, wherein each of the switches is associated with one of the keys and comprises a first and a second switch terminal, and wherein the plurality of switches is logically arranged into a switch array comprising a first switch dimension and the second dimension; a plurality of light select lines arranged so that the first light terminals of each of the plurality of lights having the same first light dimension are coupled to the same one of the plurality of light select lines; a plurality of switch lines arranged so that the first switch terminals of each of the plurality of switches having the same first switch dimension are coupled to the same one of the plurality of switch signal lines; a plurality of common lines arranged so that the second light terminals of each of the lights having the same second dimension and the second switch terminals of each of the switches having the same second dimension are coupled to the same one of the common signal lines; and a controller configured to activate any of the lights by selecting one of the light select lines and one of the common signal lines, and to detect actuation of any of the switches using one of the switch signal lines and one of the common signal lines.

Still other embodiments provide a method executable by a controller to operate a keyboard comprising a plurality of keys. Each of the keys is associated with a light and a switch, wherein the light associated with each key is coupled to one of a plurality of light select lines and to one of a plurality of common lines, and wherein the switch associated with each key is coupled to one of a plurality of switch lines and to one of the plurality of common lines. The method suitably comprises illuminating a light associated with a selected one of the plurality of keys by activating one of the switch select lines and one of the common lines that are coupled to the light associated with the selected key, and identifying a depressed one of the plurality of keys by sequentially activating each of the common lines while detecting a switch signal received on one of the plurality of switch lines, wherein the depressed key is identified based upon the activated common line and the switch line receiving the switch signal.

These and other embodiments, aspects and other features are described in more detail below.

BRIEF DESCRIPTION OF THE DRAWING FIGURES

Exemplary embodiments will hereinafter be described in conjunction with the following drawing figures, wherein like numerals denote like elements, and:

DETAILED DESCRIPTION

The following detailed description of the invention is merely exemplary in nature and is not intended to limit the invention or the application and uses of the invention. Furthermore, there is no intention to be bound by any theory presented in the preceding background or the following detailed description.

Various embodiments provide devices, systems and/or processes that allow particular keys of a keyboard to be individually illuminated using a common set of signal lines for both illumination and keypress detection functions. More particularly, the keyboard is logically arranged into at least one multi-dimensional array that allows the keys to be individually illuminated. By connecting the common signal lines to both a light and to a switch associated with a particular key, the signaling for one dimension of the array can be shared for multiple purposes. The common lines may provide, for example, a shared path to ground (or another appropriate signal reference) that could be provided to either a light or to a switch, as needed for the particular function being performed. Additional detail about various exemplary embodiments is provided below.

Figure 1:
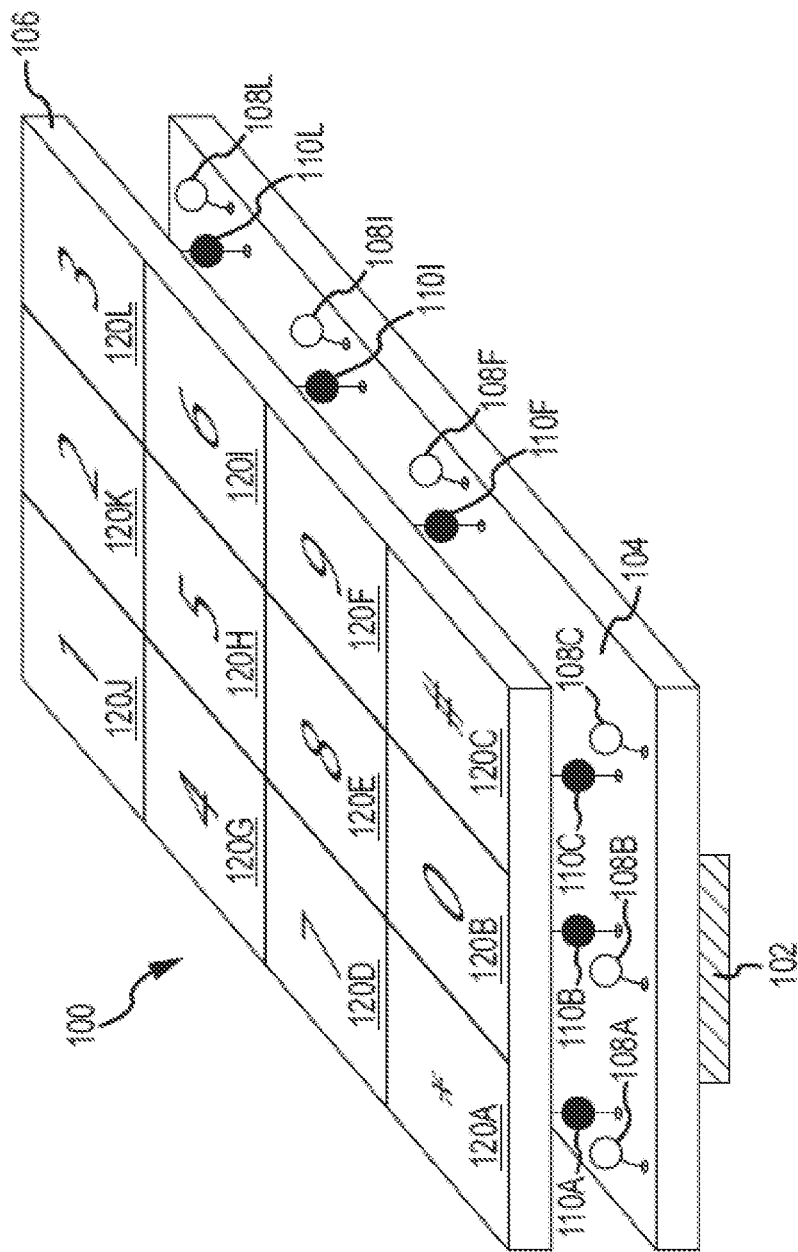
FIG. 1 is a diagram of an exemplary 4×3 keyboard system with individually-controllable lights for each key.

Turning now to the drawing figures and with initial reference to FIG. 1, an exemplary keyboard system 100 suitably includes a keyboard 106 with an appropriate number of keys 120 arranged in any manner. Each key 120 in keyboard 106 is associated with a light 108 and with a switch 110, as described more fully below. The various lights 108, switches 110 and keys 120 may be mechanically supported by a printed circuit board (PCB) or other substrate 104, which may be manufactured to provide some or all of the various signal interconnections to components 108, 110 as described herein, including the shared common lines described below.

Keyboard 106 is any sort of device or component with one or more keys 120 that are each depressable or otherwise actuatable in response to applied user inputs. In the embodiment illustrated in FIG. 1, keyboard 106 is a simple numeric keypad that has twelve keys 120A-L that are physically arranged in a four-row-by-three-column matrix. Equivalent concepts, however, could be readily adapted to larger or smaller keyboards 106 that are organized and laid out in any manner, including keyboards 106 with additional keys, fewer keys, keys laid out in a non-contiguous or nonlinear fashion, and/or key arrays that are organized differently from that shown in FIG. 1. Any sort of keyboard 106 that is used in portable or stationary computer systems, remote controls, consumer electronics, audio/visual components, home appliances and/or any other products as desired.

Each key 120 is associated with a light 108 and a switch 110. In various embodiments, lights 108A-L may be implemented with any sort of incandescent, fluorescent, lasing or other light source, such as light emitting diodes (LEDs). Typically, lights 108A-8 will each have two terminals: one terminal that is connected to a light select line and another connected to a common signal line. The light is generally illuminated by applying a electric potential (or other signal) across the two terminals of the light 108 through proper control of the various signal lines. By applying a positive voltage (e.g., a battery or other reference voltage) to the signal line attached to the first terminal to while simultaneously grounding the common line attached to the second terminal, for example, the light can be appropriately illuminated.

Each switch 110 is any sort of electrical device or component capable of providing a first output when the associated key 120 is depressed, and a second output different from the first output when the associated key 120 is not depressed. Examples of different types of key switches 110 that could be used in various embodiments could include, without limitation, membrane switches, dome-shaped switches, scissor switches, capacitive switches, relays or similar mechanical switches and/or the like. Typically, each switch 110 allows a current to flow between two terminals when the switch is activated (e.g., in response to a keypress of the associated key 120). If a particular reference signal (e.g., ground) is applied at one of the switch terminals, for example, the switch will typically conduct the signal similar to a short circuit when the switch is active. Conversely, the switch will typically act similar to an open circuit when the switch is not active. Other switch types could be substituted with different applied signal logic in any number of equivalent embodiments.

System 100 is illustrated in FIG. 1 with an appropriate controller 102 that controls the various illumination and keypress detection functions described herein. Controller 102 may be a general purpose microprocessor or microcontroller with associated memory that has software or firmware for performing the various functions described herein. Other embodiments may provide controller 102 that operates using any other sort of discrete or integrated logic, such as any sort of application specific integrated circuit (ASIC), programmable gate array (e.g., an FPGA), and/or the like.

Controller 102 suitably drives and senses the various light select lines, switch lines and common lines to activate the lights 108 and to detect keypresses of keys 120. In the exemplary embodiment shown in FIG. 1, controller 102 is shown disposed on the substrate 104 (e.g., on an opposite side of substrate 104 from keyboard 106), although alternate embodiments may position controller 102 at any other location. Controller 102 suitably activates and/or senses the appropriate light select lines, switch lines and/or common lines to apply the proper electrical signals to illuminate selected lights 108 and to detect any keypresses of switched 110, as described more fully below.

Figure 2:
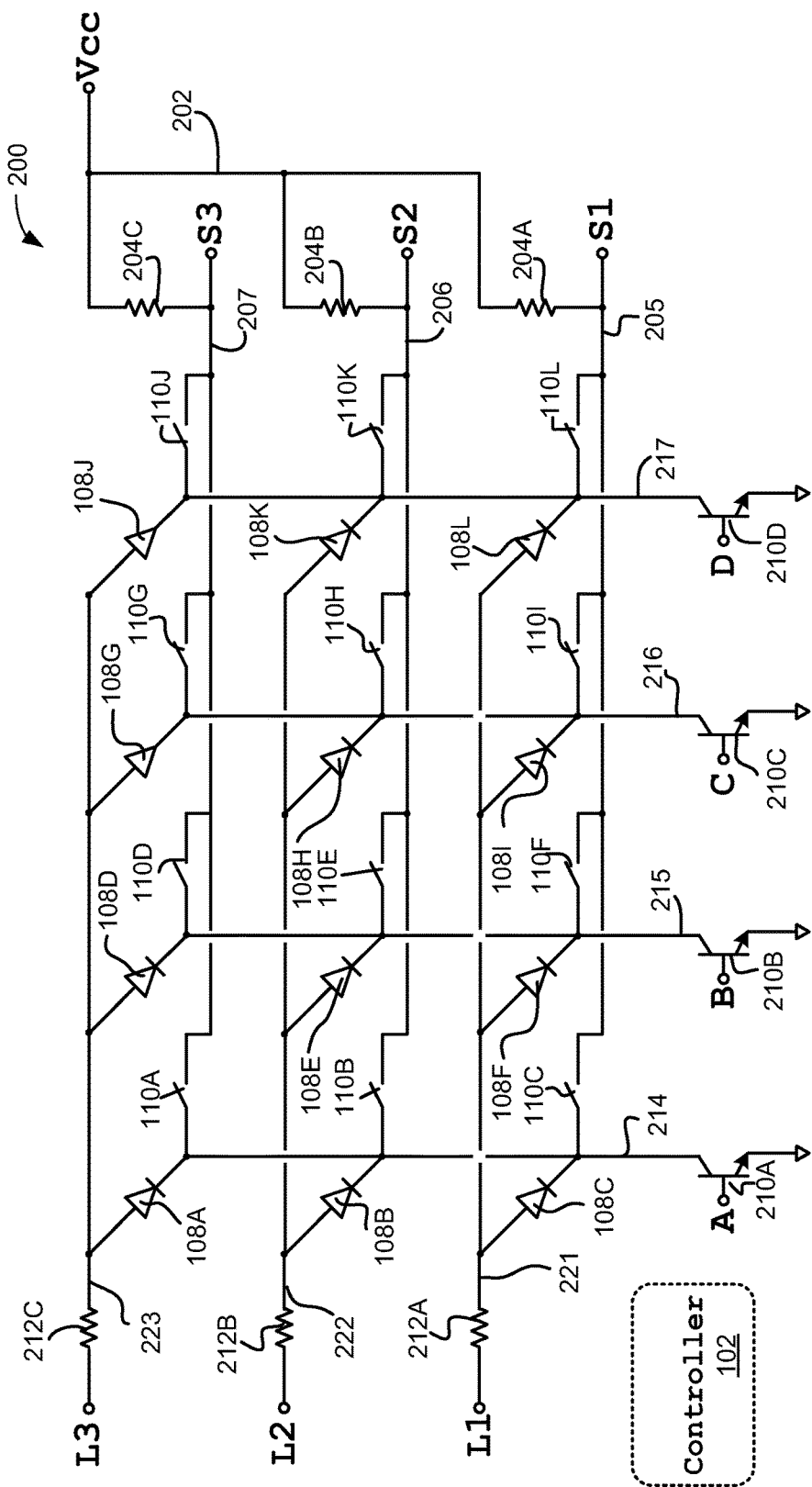
FIG. 2 is a circuit diagram of an exemplary keyboard system that includes a common set of signal lines.

Referring to FIG. 2, an exemplary circuit for a keyboard system 200 is shown to support a three-by-four matrix of keys 120. The particular circuit shown in FIG. 2 incorporates three light select lines 221-223, three switch lines 205-207, and four common lines 214-217. Equivalent embodiments could be formulated to support more keys 120, fewer keys 120, and/or keys 120 arranged in any different pattern.

In the example of FIG. 2, light select line 221 is coupled through a resistor 212A to one terminal of lights 108C, 108F, 108I and 108L. Light select line 222 is similarly coupled through resistor 212B to terminals of lights 108B, 108E, 108H and 108K, and light select line 223 is coupled through resistor 212C to terminals of lights 108A, 108D, 108G and 108J. This arrangement allows a select signal (e.g., a battery or other enable voltage) to be applied to any of lights 108A-L using only three light select lines 221-223. Light select lines 221-223 may each be directly coupled to signal pins on controller 102 in some embodiments, although other embodiments could respond to controller 102 to apply the desired electrical signals on lines 221-223 in any other manner.

Resistors 212A-C in this example suitably limit the current that flows through lights 108A-L. Because only one column 214-217 is typically enabled at any time, only one light per row is on at any time, so the resistor value may be determined using, for example, a single light model that is continuously on. Other embodiments may determine the resistor value(s) in any other manner, and equivalent embodiments may use additional or alternate electrical components, as desired.

FIG. 2 also shows switch line 205 coupled to terminals of switches 110C, 110F, 110I and 110F. Switch line 206 is coupled to terminals of switches 110B, 110E, 110H and 110K, and switch line 207 is coupled to terminals of switches 110A, 110D, 110G and 110J to create three separately-addressable "rows" of keypress detection. Generally, signals detected on switch lines 205-207 can be provided to controller 102 to detect state transitions or other effects that indicate a keypress. FIG. 2 shows switch lines 205-207 coupled to a battery or other reference signal (Vcc) 202 via resistors 204A-C (respectively). Resistors 104A-C in this example suitably "pull-up" the voltage on lines 205-207, except when a switch is closed AND the relevant column is active. In some embodiments these "pull-up" resistors 104A-C may be internal to controller 102 or other sensing circuitry. Other embodiments may use different components or signaling schemes, as desired.

In some embodiments, switch lines 205-207 coupled directly as inputs to signal pins or other input channels of controller 102. Alternate embodiments may detect voltages or other signals present on switch lines 205-207 at a separate detection circuit, or in any other manner, with the detected results provided to controller 102 in any serial, parallel or other fashion.

Light select lines 221-223 therefore provide a first addressable dimension to lights 108, and switch lines 205-207 provide a first addressable dimension for switches 110. Although the first addressable dimensions for illumination and keypress detection coincide in this example, other embodiments could connect different arrangements of lights 108 and switches 110 to select lines 221-223 and switch lines 205-207 in any other manner to create addressing schemes that may not necessarily coincide with each other.

The common lines 214-217 suitably provide a common second dimension for both selective illumination and keypress detection. As illustrated in FIG. 2, common line 214 is coupled to terminals of switches 110A, 110B, 110C that are opposite the terminals coupled to light select lines 221, 222, 223 (respectively). Common line 214 is also coupled to the terminals of switches 110A, 110B and 110C that are opposite the terminals coupled to switch lines 205, 206 and 207, respectively, to form a first addressable column of the logical array. Common line 215 is coupled to the opposing terminals of lights 108D, 108E and 108F, as well as those of switches 110D, 110E and 110F to form a second addressable column in the logical array. Column line 216 is similarly coupled to lights 108G, 108H and 108I, as well as switches 110G, 110H and 110I, thereby forming the third addressable column of the logical array. A fourth addressable column is formed by column line 217, which is coupled to lights 108J, 108K and 108L as well as switches 110J, 110K and 110L, as appropriate. The various lights 108 and switches no may be arranged in any other physical or logical order, as desired.

FIG. 2 shows common lines 214-217 each coupled to a ground or other suitable reference voltage via common line switches 210A-D, respectively. Switches 210A-D may be implemented using field effect transistors (FETs), bipolar junction transistors (BJTs), or any other types of mechanical or other switches that may be available. Activating a common line 214-217, then, typically involves applying a ground or other suitable reference signal line by closing the common line switch 210A-D associated with the activated line. It should be noted that in the exemplary embodiment shown in FIG. 2, each common line 214-217 is either pulled to ground with a very low effective impedance, or the common line 214-217 has a very high impedance, depending upon whether switches 210A-D are open or closed. This detail limits the amount of current that flows if two switches on the same row are simultaneously closed when one of the relevant columns is active, although other embodiments may be designed in any other manner.

Although the exemplary embodiment shown in FIG. 2 uses the same "row" and "column" addressing scheme for both illumination and keypress detection, equivalent embodiments could group lights 108 and switches no into different "rows" (corresponding to lines 205-207 and 221-223) while sharing common "columns" corresponding to common lines 214-217. "Rows" and "columns", as used herein, are intended to conveniently refer to the two dimensions of a logical array that can be used to address the particular lights 108 and switches 110 associated with keys 120. In practice, the array may be equivalently referenced using any sort of orthogonal, semi-orthogonal, Cartesian, radial, and/or other coordinate system or scheme other than traditional mechanical "row" and "column" constructs.

In operation, then, controller 102 is able to individually address each light 108 using one of the light enable lines 221-223 and one of the common lines 214-217. As noted above, it is generally desirable to create an electrical potential across the two terminals of the selected light 108 to drive an electrical current, thereby illuminating the light 108. This potential can be created by connecting the two terminals of the light 108 to reference or other known values, such as a supply voltage or ground. To activate a particular light 108, the controller 102 activates the switch enable line 221-223 that is coupled to the first terminal of the identified light 120. The controller 102 also activates the common line 214-217 that is coupled to the opposite terminal of the particular light 108. To activate light 108E, for example, controller 102 would activate light select line 222 and common line 215 to complete a circuit that applies an electrical potential across light 108E, thereby illuminating the light. By selectively activating one of the light select lines 221-223 and one of the common lines 214-217, a circuit can be completed through any of the lights 108 in the array, thereby allowing for individual selection and illumination of the particular selected light 108 as desired.

In some embodiments, multiple sets of light rows could be used to provide control over color, brightness and/or other aspects of illumination. To control the color of the light produced, for example, some embodiments could provide multiple sets of lights 108 so that each key was associated with multiple lights 108 of different colors (e.g., a red light, a blue light and a green light). By activating or modulating the lights of different colors that are associated with each key, any number of different illumination colors could be generated. Each additional set of lights would typically contain its own set of light selection lines (e.g., similar to lines 221-223), but the additional light sets could nevertheless couple to the common signal lines 214-217, provided relevant component ratings are appropriately selected.

Controller 102 is also able to individually detect keypresses of any key 120 as switches 110 are actuated. In some embodiments, controller 102 sequentially activates switches 210A-D to thereby apply the reference voltage on each of the common lines 214-217 at different times. If the reference voltage is subsequently observed on one of the switch lines 205-207, an actuated switch 110 can be deduced to be present on the switch line 205-207 providing the reference voltage. The particular switch 110 can then be identified from the active common line 214-217. In the exemplary embodiment shown in FIG. 2, each switch line 205-207 would typically be held at a high logic potential (due to the "pull-up" resistor 204) until one of the switches 110 created a connection to an active common line 214-217. If the user depresses the key 120E corresponding to switch 110E, for example, the closed switch 110E would apply the reference voltage to switch line 206 when common line 215 is active. Since the measurement of the reference voltage on switch line 206 was received when common line 215 was active, controller 102 is able to deduce that switch 110E is closed, thereby indicating a keypress of key 120E. In some implementations, this circuit can be detected using digital logic in controller 102 or elsewhere that identifies a low logic potential or a falling edge on any of the switch lines 205-207. A microcontroller (e.g., controller 102) may use a falling edge interrupt, for example, to reduce polling overhead. Other embodiments may use other sampling or signal measurement techniques, as desired.

As noted above, a press of any key 120 would typically actuate one of the switches 110A-L in the switch array, thereby allowing a reference signal applied on one side of the switch 110 to be detectable on the other side of the switch 110. A ground reference applied by an active common line 214-217, for example, could be detected on one of the switch lines 205-207 as described above. Equivalently, a battery or other reference voltage 202 applied by one of the switch lines 205-207 could be detected on a common line 214-217, provided that the activation and detection circuitry were modified slightly. Note that the either the switch lines 205-207 or the common lines 214-217 could be associated with either the "first" or the "second" dimension described herein. Further, the common signal lines 214-217 could provide the "battery" or reference voltage and signal 202 could be coupled to ground in an equivalent embodiment. In such an embodiment, the light selection lines 221-223 would typically provide the ground signal as well to create potential differences across the terminals of lights 108.

Note that even though light activation and keypress detection processes both make use of a shared set of common lines 214-217, both light activation and keypress detection may be available on a more-or-less simultaneous basis through the use of any sort of modulation, multiplexing or a similar resource sharing scheme, as described more fully below. Alternate embodiments may multiplex control signals applied from controller 102 to any of the components in system 200 in any manner, or use any sort of time, frequency or other domain multiplexing as desired. Still other embodiments may not attempt to provide simultaneous illumination and key detection at all, or to provide such features in other ways.

Figure 3:
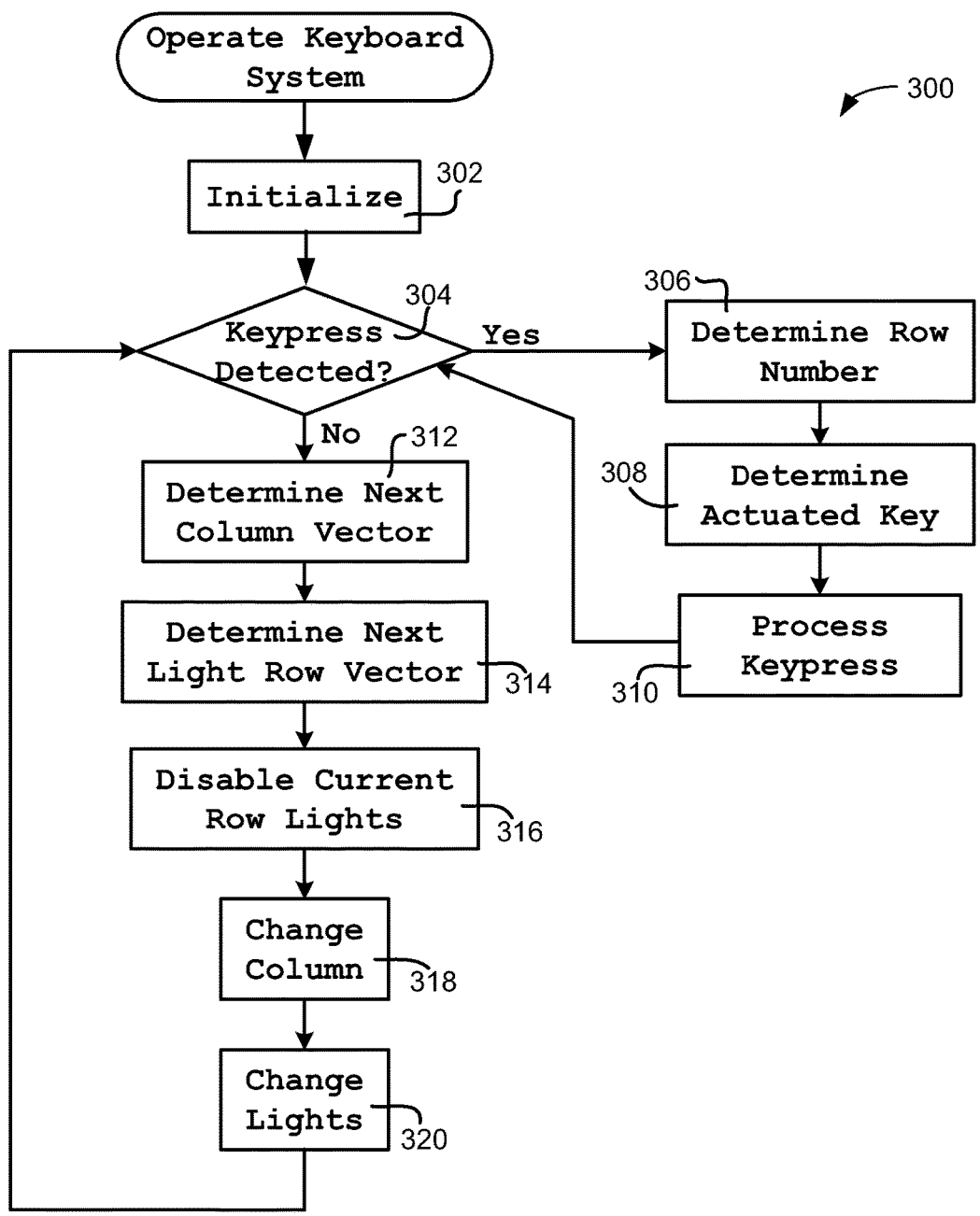
FIG. 3 is a flowchart of an exemplary technique for operating a keyboard system that includes illumination features.

Additional detail about exemplary techniques executable by controller 102 or similar control logic is provided below with reference to FIG. 3. Note that FIG. 3 shows various functions that may be implemented using any convenient processing hardware, software, firmware or other logic. In various embodiments, the various functions shown in FIG. 3 are carried out with an ASIC or general purpose processor executing software or firmware. Other types of controllers 102 are described above, and any sort of controller 102 or other control logic could be used to implement process 300.

FIG. 3 shows an exemplary process 30o executable by controller 102 or the like to operate the keyboard system 100 that includes any number of keys 120 logically arranged into any number of "rows" and "columns". As shown in FIG. 3, operating a keyboard system 100 suitably includes, after initialization (function 302), sequentially determining whether a switch 110 is closed (function 304) and changing any light values (function 320) for each of the various columns (function 318). The exemplary process shown in FIG. 3 may be supplemented, reorganized or changed in any manner.

Initialization (function 302) suitably includes setting any variables for subsequent processing. Various embodiments may also disable the lights 108 on one more rows of the logical array, and/or may set any timers or other processing parameters as desired. Timing of process 300 may be organized in any manner. If the switching speed of controller 102 and common line switches 210A-D is significantly faster than the decay time of the illumination provided by lights 108, for example, it may be possible to activate any number of desired lights and then detect keypresses before the activated light fully decays to an extent that would be noticeable to a user. The activated lights can then be recharged (e.g., by repeating process 300) as desired.

Typically, initialization function 302 involves selecting a first common signal line 214-217 that corresponds to a first "column" (or other common dimension) for initial processing. Each of the various "columns" are then sequentially selected during subsequent processing, as described herein.

Keypresses are detected in any manner (function 304). In various embodiments, the controller 102 determines if any of the switches 110 are closed by detecting the presence of a reference voltage (e.g., ground) on any of the switch lines 205-207. If the reference voltage is present on any of the lines 205-207, then it can be deduced that a circuit exists through one of the switches 110 to the active column line 214-217.

If a keypress is detected, then the row number of the particular switch is determined (function 306) as appropriate. In various embodiments, the row number is determined by sequentially checking each of the switch lines 205-207 to identify the line 205-207 that provides the reference value. In various embodiments, the keypress detection function (function 304) and row determination function (function 306) may be combined as appropriate.

The key 120 corresponding to the actuated switch 110 may be determined in any manner. In various embodiments, the actuated key 120 can be deduced from the switch line 205-207 that received the reference signal and the column of the active common line 214-217. That is, the switch line 205-207 typically identifies the row (or other first dimension) of the actuated key 120, and the active common line 214-217 identifies the column (or other second dimension) in the logical array. The actuated key 120 may be identified by a number or other logical representation in controller 102, as desired.

Controller 102 may take any appropriate action in response to the actuated key 120 (function 310). In many embodiments, controller 102 simply reports the alphanumeric or other value associated with the particular key. If key 120H (FIG. 1) is actuated, for example, controller 102 would typically report that a "5" had been entered by the user in any conventional manner. Reporting may be provided on a separate output channel of controller 102 to a processor or interface module associated with a computer, remote control, set top box or other television receiver, or any other host device as desired. Other embodiments may process inputs received using keyboard system 100 in any other manner.

After any keypresses on the active column are detected and processed, controller 102 suitably determines the next column to be selected (function 312). This may be determined, for example, by incrementing a counter variable (modulated to avoid exceeding the total number of columns). If controller 102 selects the various columns using a vector stored in a register, memory address or the like, then the counter variable may be used to select as desired bit or other vector value, as appropriate (e.g., by exponentiating $2^j$, wherein "j" represents the modulated counter to sequence through columns represented by successive bit vectors).

Lights 108 may be activated or deactivated in any manner (functions 316, 320). In various embodiments, the various lights 108 in each column 214-217 are represented by a row vector, with each bit of the vector being set or reset as desired to activate the corresponding light 108 (function 314). Lights 108G, 108H and 108I sharing common line 216, for example, could be represented by a three bit value, wherein each bit corresponds to one of the lights 108G-I, and wherein the corresponding bit is set to illuminate each light 108. Alternately, function 314 could involve equivalent logic that individually or collectively sets or resets the various lights 108 coupled to each common line 214-217 as desired.

In the exemplary embodiment shown in FIG. 3, the lights 108 on the current column are disabled (function 316) before changing to a different column line 214-217 (function 318). As noted above, the various column lines 214-217 may be sequentially activated or deactivated by controlling switches 210A-D, as desired. After switching to the new column (function 318), the lights 108 on that column may be activated (function 320). The lights may be selected and activated, for example, using the row vectors described in function 314, or in any other manner.

Lights 108 may remain active for any appropriate duration. In some embodiments, the lights 108 are deactivated prior to subsequent processing, although other embodiments may leave lights 108 active while keypresses are detected, as desired. As noted above, the particular relative timing of the light activation and keypress detection functions may be adjusted to provide sufficient illumination and sufficient response to keypresses in any manner. Process 300 may be repeated on any frequency and for any number of repetitions as desired to ensure that proper illumination and keypress detection is maintained throughout operation of keyboard system 100.

As noted previously, the discussion herein often refers to a keyboard system that is logically arranged into a two dimensional array, such as the array of "rows" and "columns" shown in FIGS. 1 and 2, for simplicity. Typically, the shared common lines 214-217 provide one dimension of the logical array that allows for common addressing of lights 108 or switches 110 associated with each key 120. The other dimension, however, may be arranged in any manner desired by connecting the various lights 108 and switches 110 in any order, structure, pattern or other manner. References to dimensions such as "rows" and "columns" herein are intended as logical references that may or may not correspond to the physical layout of the keyboard 106. Although some embodiments may use the physical layout of the keyboard 106 to assign logical relationships, other embodiments may use any logical groupings of keys 120 that are convenient based upon the implementation. As a result, keys 120 in a common "row" or "column" may not necessarily appear to be mechanically aligned with each other in some embodiments, but rather may simply be a part of a common logical group that can be addressed with a common signal line. References to "rows" and "columns" used herein, then, should be interpreted as logical constructs that may refer to any number of different physical groupings of keys 120, switches 110, lights 108 and/or other components.

While several exemplary embodiments have been presented in the foregoing detailed description, it should be appreciated that a vast number of alternate but equivalent variations exist, and the examples presented herein are not intended to limit the scope, applicability, or configuration of the invention in any way. To the contrary, various changes may be made in the function and arrangement of elements described without departing from the scope of the claims and their legal equivalents.

The term "exemplary" is used herein to represent one example, instance or illustration that may have any number of alternates. Any implementation described herein as exemplary is not necessarily to be construed as preferred or advantageous over other implementations.

What is claimed is:

1. A lighted keyboard system comprising:
   a plurality of keys logically arranged into an array such that each of the keys is logically addressable by a row value and a column value;
   a plurality of lights, each light of the lights associated with said each of the keys and said each light having a first light terminal of a plurality of first light terminals and a second light terminal of a plurality of second light terminals to thereby illuminate at least a portion of the keyboard system when a voltage is applied across the first light terminal and the second light terminal;
   a plurality of switches, each switch of the switches associated with and actuated by said each of the plurality of keys and having a first switch terminal of a plurality of first switch terminals and a second switch terminal of a plurality of second switch terminals;
   a plurality of light select lines, wherein each of the light select lines is coupled to each of the first light terminals associated with the keys having a common row value;
   a plurality of switch lines, wherein each of the switch lines is coupled to each of the first switch terminals associated with the keys having the common row value, wherein said each of the switch lines is coupled to a first reference voltage by a resistor;
   a plurality of common lines, wherein each of the common lines coupled to controllably supply a second reference voltage that is different from the first reference voltage to both the second light terminals and to the second switch terminals associated with the keys having a common column value, wherein the supplying of the second reference voltage on the common lines illuminates the plurality of lights when the light select lines is activated, and wherein the same second reference voltage supplied on the plurality of common lines is detectable on the plurality of switch lines when the plurality of switches is activated, and wherein a high impedance condition exists on said each common line of the common lines when the second reference voltage is not supplied to thereby prevent current flow on said each common line of the common lines; and
   a controller coupled to the plurality of light select lines, the plurality of switch lines and the plurality of common lines, wherein the controller is configured to illuminate one or more illuminated keys by activating the light select lines and the common lines associated with the one or more illuminated keys, and to simultaneously detect an actuated one of the plurality of keys using the switch lines and the common lines by detecting value changes on said each of the switch lines as the controller sequentially applies the second reference voltage to the common lines that are activated to illuminate the one or more illuminated keys;

wherein said each of the common lines is sequentially coupled to the second reference voltage, wherein the controller detects when one of the switches is actuated by detecting a presence of the second reference voltage on one of the switch lines, and wherein the controller is further configured to identify the actuated one of the switches from a row of the detected second reference voltage and a column of said each of the common lines that is sequentially coupled to the second reference voltage.

2. The keyboard system of claim 1, wherein the controller is further configured to activate a light associated with a selected one of the plurality of keys by activating a light select line associated with a row of the selected one of the plurality of keys and a common line associated with the column of the selected one of the plurality of keys.

3. A lighted keyboard system comprising:
a plurality of keys;
a plurality of lights, wherein each of the lights is associated with each one of the keys and said each of the lights comprises a first light terminal and a second light terminal to thereby illuminate at least a portion of the keyboard system when a voltage is applied across the first and second light terminals, and wherein the plurality of lights is logically arranged into a light array, said each of the lights comprising a first light dimension and a second light dimension;
a plurality of switches, wherein each of the switches is associated with said each one of the keys and said each of the switches comprises a first switch terminal and a second switch terminal, and wherein the plurality of switches is logically arranged into a switch array, said each of the switches comprising a first switch dimension and a second switch dimension;
a plurality of light select lines arranged so that said each of the plurality of lights having the first light terminal and the first light dimension, wherein each one of the plurality of light select lines is coupled to the first light terminal and the first light dimension;
a plurality of switch lines arranged so that each of the switch lines having the first switch terminal and the first switch dimension, wherein said each one of the plurality of switch lines is coupled to the first switch terminal and the first switch dimension, wherein each of the switch lines is coupled to a first reference voltage by a resistor;
a plurality of common lines arranged so that said each of the lights having the second light terminal and the second dimension and said each of switches having the second switch terminal and the second dimension are all coupled to each common line of the common lines, and wherein said each of the common lines is configured to controllably supply a second reference voltage that is different from the first reference voltage, wherein the second reference voltage is applied to both the lights and to the switches, and wherein a high impedance condition exists on said each common line of the common lines when the second reference voltage is not supplied to thereby prevent current flow on said each common line; and
a controller configured to illuminate the lights by selecting the light select lines and by providing the second reference voltage on said each one of the common lines associated with the lights to be illuminated, and to simultaneously detect actuation of the switches by detecting a presence of the second reference voltage that is supplied by said each one of the common lines at the switch lines as the second reference voltage is sequentially applied to said each one of the common lines that provide the second reference voltage to illuminate the keys to be illuminated, wherein said each of the common lines is sequentially coupled to the second reference voltage, wherein the controller detects when one of the switches is actuated by detecting the presence of the second reference voltage on one of the switch lines, and wherein the controller is further configured to identify the actuated switch of the switches from a row of the detected second reference voltage and a column of said each of the common lines that is sequentially coupled to the second reference voltage.

4. The keyboard system of claim 3, wherein the controller is further configured to activate a selected one of the plurality of lights by selecting one of the light select lines corresponding to the first light dimension of the selected one of the lights and a common line corresponding to the second dimension the selected one of the lights.

5. The keyboard system of claim 3 wherein the controller is further configured to select one of the common lines by activating a select switch that switchably couples the selected one of the common lines to the second reference voltage.

6. The keyboard system of claim 3 wherein the first light dimension and the first switch dimension coincide.

7. The keyboard system of claim 3 wherein the first light dimension and the first switch dimension do not coincide.

8. The keyboard system of claim 3 wherein said each of the lights is a light emitting diode that is coupled to receive an enable signal from the controller via said one of the plurality of light select lines.

9. A method executable by a controller to operate a keyboard comprising:
arranging a plurality of keys logically into an array such that each of the keys is logically addressable by a row value and a column value;
having a plurality of lights, each light of the lights associated with said each of the keys and said each light having a first light terminal of a plurality of first light terminals and a second light terminal of a plurality of second light terminals to thereby illuminate at least a portion of the keyboard when a voltage is applied across the first light terminal and the second light terminal;
having a plurality of switches, each switch of the switches associated with and actuated by said each of the plurality of keys and having a first switch terminal of a plurality of first switch terminals and a second switch terminal of a plurality of second switch terminals;
having a plurality of light select lines, wherein each of the light select lines is coupled to each of the first light terminals associated with the keys having a common row value;
having a plurality of switch lines, wherein each of the switch lines is coupled to each of the first switch terminals associated with the keys having the common row value, wherein said each of the switch lines is coupled to a first reference voltage by a resistor;

having a plurality of common lines, wherein each of the common lines coupled to controllably supply a second reference voltage that is different from the first reference voltage to both the second light terminals and to the second switch terminals associated with the keys having a common column value, wherein the supplying of the second reference voltage on the common lines illuminates the plurality of lights when the light select lines is activated, and wherein the same second reference voltage supplied on the plurality of common lines is detectable on the plurality of switch lines when the plurality of switches is activated, and wherein a high impedance condition exists on said each common line of the common lines when the second reference voltage is not supplied to thereby prevent current flow on said each common line of the common lines; and coupling the controller to the plurality of light select lines, the plurality of switch lines and the plurality of common lines, wherein the controller is configured to illuminate one or more illuminated keys by activating the light select lines and the common lines associated with the one or more illuminated keys, and to simultaneously detect an actuated one of the plurality of keys using the switch lines and the common lines by detecting value changes on said each of the switch lines as the controller sequentially applies the second reference voltage to the common lines that are activated to illuminate the one or more illuminated keys; wherein said each of the common lines is sequentially coupled to the second reference voltage, wherein the controller detects when one of the switches is actuated by detecting a presence of the second reference voltage on one of the switch lines, and wherein the controller is further configured to identify the actuated one of the switches from a row of the detected second reference voltage and a column of said each of the common lines that is sequentially coupled to the second reference voltage.

10. The method of claim 9 wherein the sequential coupling further comprises sequentially actuating, for said each of the common lines, a switch line of the switch lines that couples the column of said each of the common lines to the first reference voltage when said each of the common lines is activated, and that otherwise creates the high impedance condition on said each of the common lines.

\* \* \* \* \*